(12) United States Patent
Kim

(10) Patent No.: US 7,978,553 B2
(45) Date of Patent: Jul. 12, 2011

(54) APPARATUS FOR CONTROLLING I/O STROBE SIGNAL IN SEMICONDUCTOR MEMORY APPARATUS

(75) Inventor: Kwi Dong Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 93 days.

(21) Appl. No.: 12/493,354

(22) Filed: Jun. 29, 2009

(65) Prior Publication Data

US 2010/0118629 A1   May 13, 2010

(30) Foreign Application Priority Data

Nov. 12, 2008   (KR) .................. 10-2008-0112005

(51) Int. Cl.
*G11C 7/02* (2006.01)
(52) U.S. Cl. ............... 365/210.1; 365/189.02; 365/241; 365/236; 365/189.04; 365/189.05
(58) Field of Classification Search ........... 365/210, 365/189.02, 210.1, 241, 236, 196, 189.04, 365/189.15, 194
See application file for complete search history.

(56) References Cited

U.S. PATENT DOCUMENTS

| | | | |
|---|---|---|---|
| 6,009,040 A * | 12/1999 | Choi et al. .............. | 365/210.1 |
| 2008/0008011 A1 | 1/2008 | Moon et al. | |
| 2008/0205177 A1 | 8/2008 | Kim et al. | |

FOREIGN PATENT DOCUMENTS

| | | |
|---|---|---|
| JP | 01-276493 A | 11/1989 |
| KR | 1020060022219 A | 3/2006 |
| KR | 10-0655084 B1 | 12/2006 |

* cited by examiner

*Primary Examiner* — Thong Q Le
(74) *Attorney, Agent, or Firm* — Ladas & Parry LLP

(57) ABSTRACT

A sensing enable signal control circuit determines a driving timing of an I/O sense amplifier based on a read-out result of data, which is stored in a dummy cell of a semiconductor memory apparatus. The sensing enable signal control circuit in a semiconductor memory apparatus includes a detection code generating unit configured to output a detection code according to a voltage level of dummy cell data, which are read out from a dummy cell through at least one read operation, in response to a column select enable signal, and a multiplexer configured to receive the detection code and a default code and output a delay code to delay a sensing enable signal.

19 Claims, 8 Drawing Sheets

APPARATUS FOR CONTROLLING I/O STROBE SIGNAL IN SEMICONDUCTOR MEMORY APPARATUS

CROSS-REFERENCES TO RELATED APPLICATION

The present application claims priority under 35 U.S.C. 119(a) to Korean application number 10-2008-0112005, filed on Nov. 12, 2008, in the Korean Patent Office, which is incorporated by reference in its entirety as if set forth in full.

BACKGROUND

Embodiments of the present invention relate generally to a semiconductor memory apparatus and, more particularly, to a sensing enable signal control circuit configured to control a read operation of the semiconductor memory apparatus.

Generally, during a read operation, a semiconductor memory apparatus amplifies cell data through a bit line sense amplifier. Subsequently, an I/O sense amplifier receives the data from a bit line sense amplifier through local I/O lines LIO and LIOb, and then amplifies the data again. This amplified data is transferred to an output unit through global I/O lines GIO and GIOB.

The data is transferred from the I/O sense amplifier to the global I/O lines GIO and GIOB after a delay time that is determined by a sensing enable signal 'IOSTB', which is generated in response to a column select enable signal 'YI'.

FIG. 1 is a circuit diagram shown for illustrating a read operation in an exemplary conventional semiconductor memory apparatus.

Referring to FIG. 1, a sensing enable signal generating unit 10 receives a column select enable signal 'YI' and a delay code to output a sensing enable signal 'IOSTB' by delaying the column select enable signal 'YI' by a delay time determined by the delay code.

An I/O sense amplifier 12 receives a first amplified data, which has been amplified by a bit line sense amplifier, through local I/O lines LIO and LIOb and then performs a secondary amplification (i.e., the I/O sense amplifier amplifies the first amplified data again) and latches the received data. As the sensing enable signal 'IOSTB' is enabled, a latched data is transferred to a pipe latch 16 via a multiplexer 14 through global I/O lines GIO and GIOB.

The data transferred to the pipe latch 16 is output to an output pad DQ through an output unit 18.

As mentioned above, in the exemplary conventional semiconductor memory apparatus, the time that the data stored in a memory cell is read out is varied according to the enable timing of the sensing enable signal 'IOSTB'. The faster the generation time of the sensing enable signal 'IOSTB' is, the more a data access time tAA is reduced.

Therefore, a delay time is determined in such a manner that the sensing enable signal 'IOSTB' is enabled based on the sensing ability of the I/O sense amplifier 12.

That is, when a voltage difference between the local I/O lines LIO and LIOb exceeds a predetermined voltage ($\Delta V$), the I/O sense amplifier 12 can obtain a sensing margin. However, it is necessary to take a time (tYIO) to obtain the sensing margin. Therefore, after the required time to obtain the sensing margin has expired, the sensing enable signal 'IOSTB' has to be enabled to carry out an exact read operation.

FIG. 2 is a timing chart showing an enable timing of the sensing enable signal based on the voltage difference between the local I/O lines LIO and LIOb in the exemplary conventional semiconductor memory apparatus.

Referring to FIG. 2, the column select enable signal 'YI' is enabled to a high level (the select enable signal is indicated by a solid line) and data is then loaded on a pair of the local I/O lines LIO and LIOb. After a period of time tYIO, the voltage difference between the local I/O lines LIO and LIOb is $\Delta V$, the sensing enable signal 'IOSTB' is enabled (the sensing enable signal IOSTB is indicated by a dotted line) and the data stored in the cell is transferred to the global I/O lines GIO and GIOB.

At this time, the delay time (tYIO), which is the period of time between when the column select enable signal is enabled and when sensing enable signal 'IOSTB' is enabled, is determined by a simulation result of the semiconductor memory apparatus. However, in the actual semiconductor memory apparatus, the sensing enable signal 'IOSTB' is enabled after a delay time determined by the simulation and an additional margin '$\alpha$' (as a result, the total delay time=tYIO+$\alpha$) in order to guarantee the reliability of the operation environment.

Furthermore, since the time required to obtain the sensing margin is varied according to external environments, such as pressure, voltage, and temperature (PVT), the duration of the enablement of the sensing enable signal 'IOSTB' enabled is determined according to a worst case scenario.

As mentioned above, the greater the delay of the enabling of the sensing enable signal 'IOSTB', the greater the delay in transferring the data to the global I/O lines GIO and GIOb, and the data access time tAA is also increased.

Accordingly there is a problem in the conventional semiconductor memory apparatus, in that the data access time tAA is unnecessarily increased, since the enable timing of the sensing enable signal 'IOSTB' is determined according to a deteriorated environment, even when a current external environment may be good.

To solve the above and other problems, an enable timing of the sensing enable time can be corrected by testing the read operation after mass producing the semiconductor memory apparatuses; however, testing every semiconductor memory apparatus and controlling the delay time accordingly, is very time consuming, and therefore very expensive.

SUMMARY

A sensing enable signal control circuit capable of determining a driving timing of an I/O sense amplifier based on a read-out result of data, which is stored in a dummy cell of a semiconductor memory apparatus, is described herein.

A sensing enable signal control circuit capable of adaptively operating according to external environments, by determining a delay time to be required to obtain a sensing margin while a few numbers of initial read operations are carried out, is described herein.

According to one aspect, a sensing enable signal control circuit in a semiconductor memory apparatus comprises a detection code generating unit configured to output a detection code according to a voltage level of dummy cell data, which are read out from a dummy cell through at least one read operation, in response to a column select enable signal, and a multiplexer configured to receive the detection code and a default code and output a delay code to delay a sensing enable signal.

According to another aspect, a sensing enable signal control circuit in a semiconductor memory apparatus comprises a delay code generating unit configured to output a dummy sensing enable signal by delaying a column select enable signal according to a detection code which is produced in response to the column select enable signal and dummy cell data, a comparison unit configured to output dummy cell data and output a detection code fixing signal according to a voltage level of the dummy cell data in response to the dummy sensing enable signal, and a multiplexer configured to receive the detection code and a default code and output a delay code to delay a sensing enable signal.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

In the embodiments of the present invention, results of an actual read operation are used in detecting the time until sensing margin (a voltage difference) between a pair of local I/O lines is obtained at a read operation of a semiconductor memory apparatus.

According to an embodiment of the present invention, a predetermined data is written in a dummy cell of the semiconductor memory apparatus and a voltage level of the data, which are stored in the dummy cell, is determined according to a read command input. When a voltage level of the read-out data is determined to be the same as that of the stored data, a delay time of a sensing enable signal to be used to read out data from an actual cell is replaced with that of a sensing enable signal to be used to read out data from a dummy cell.

While an output delay time of the sensing enable signal is determined by reading out the dummy cell data, the read operation of the memory cell is carried out according to the sensing enable signal, which is output according to a predetermined delay time determined and specified by a designer.

After determining the delay time to output the sensing enable signal using the sensing enable signal control circuit according to an embodiment of the present invention, the delay time determined by the designer is not used and the sensing enable signal is produced with the delay time according to one embodiment.

Preferably, according to an embodiment of the present invention, the dummy cells one embodiment are designed to be the same as the actual memory cells and to carry out the read and write operations under the same environments and conditions of the actual memory cells.

Hereinafter, the embodiments of the disclosure will be described in detail below referring the accompanying drawings.

Figure 1:
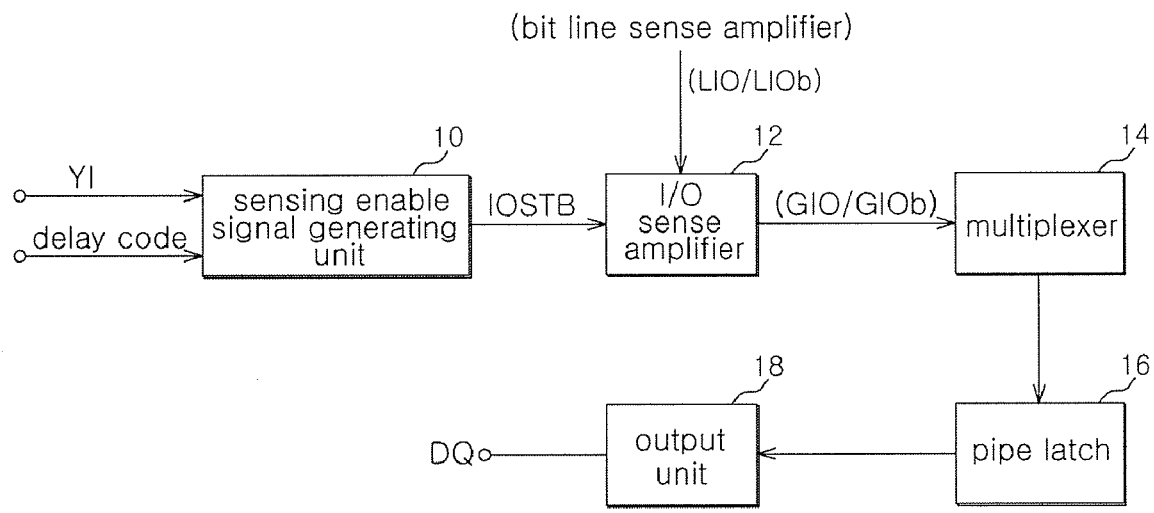
FIG. 1 is a circuit diagram shown for illustrating a read operation in an exemplary conventional semiconductor memory apparatus.
Figure 2:
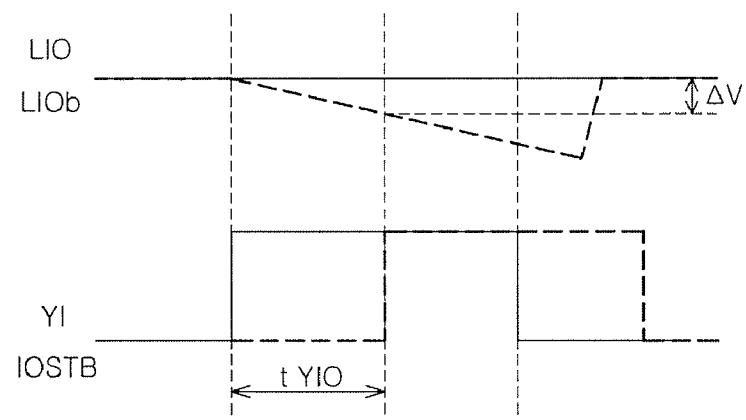
FIG. 2 is a timing chart showing an enable timing of the sensing enable signal based on the voltage difference between the local I/O lines in the exemplary conventional semiconductor memory apparatus.
Figure 3:
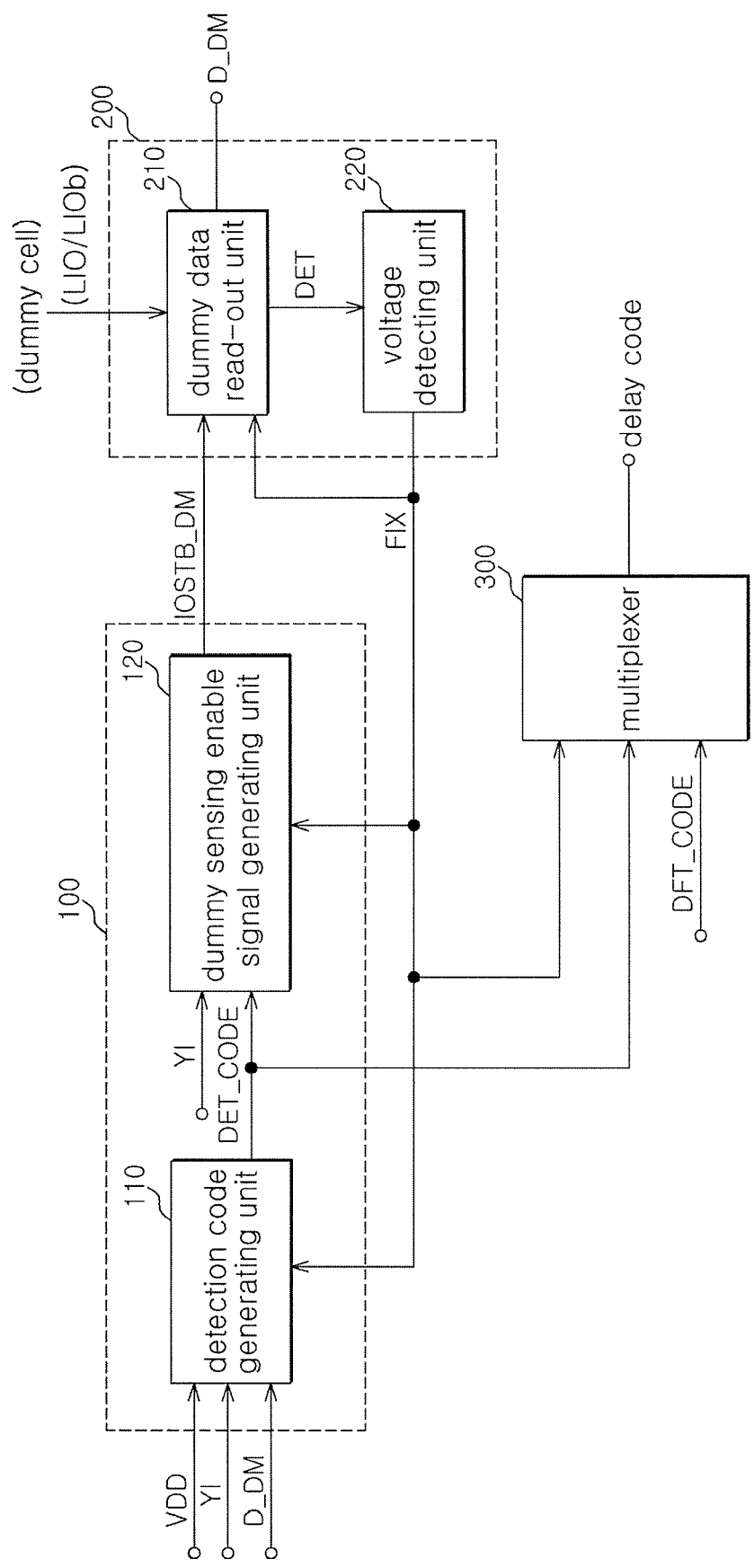
FIG. 3 is a block diagram shown for illustrating an exemplary structure of a sensing enable signal control circuit of a semiconductor memory apparatus according to an embodiment of the present invention.

FIG. 3 is a block diagram showing an example of a structure of a sensing enable signal control circuit of a semiconductor memory apparatus according to an embodiment of the present invention.

Referring to FIG. 3, the sensing enable signal control circuit of the semiconductor memory apparatus includes a delay code generating unit 100, a comparison unit 200, and a multiplexer 300.

The delay code generating unit 100 delays a column select enable signal 'YI' in response to a detection code 'DET_CODE' and then outputs a dummy sensing enable signal 'IOSTB_DM'. The detection code 'DET_CODE' is produced in response to the column select enable signal 'YI' and a dummy cell data 'D_DM'. The comparison unit 200 outputs the dummy cell data 'D_DM' and outputs a detection code fixing signal 'FIX' according to the voltage level of the dummy cell data 'D_DM' in response to the dummy sensing enable signal 'IOSTB_DM'. The multiplexer 300 receives the detection code 'DET_CODE' and a default code 'DFT_CODE' and outputs a delay code.

In more detail, according to an embodiment of the present invention as shown in FIG. 3, the delay code generating unit 100 can include a detection code generating unit 110 and a dummy sensing enable signal generating unit 120. The detection code generating unit 110 receives power supply voltage 'VDD', the column select enable signal 'YI', and the dummy cell data 'D_DM', and outputs the detection code 'DET_CODE'. The dummy sensing enable signal generating unit 120 delays the column select enable signal 'YI' in response to the detection code 'DET_CODE', and outputs the dummy sensing enable signal 'IOSTB_DM'.

The comparison unit 200 includes a dummy data read-out unit 210 and a voltage detecting unit 220. The dummy data read-out unit 210 reads the data stored in a dummy cell through local I/O lines LIO and LIOb and outputs the dummy cell data 'D_DM'. The dummy data read-out unit 210 outputs a detection data 'DET' by delaying the dummy cell data 'D_DM' for a predetermined time in response to the dummy sensing enable signal 'IOSTB_DM'. The voltage detecting unit 220 receives the detection data 'DET' and then outputs the detection code fixing signal 'FIX'.

The operation of the sensing enable signal control circuit will be described in detail below.

A predetermined data (any one of "High", "Low", and "Don't care") is written as a fixation value in a specific dummy cell of the semiconductor memory device using a word line driver (not shown) for the dummy cell.

In this state, if a read command is input, the detection code generating unit 110 receives the power supply voltage 'VDD', the column select enable signal 'YI' (which is enabled in response to the read command), and the dummy cell data 'D_DM' output from the dummy data read-out unit 210. When the column select enable signal 'YI' is enabled, the detection code 'DET_CODE' is produced according to a voltage level of the dummy cell data 'D_DM'.

The dummy sensing enable signal generating unit 120, which receives the column select enable signal 'YI' and the detection code 'DET_CODE' from the detection code generating unit 110, delays the column select enable signal 'YI' according to the value of the detection code 'DET_CODE' so as to output the dummy sensing enable signal 'IOSTB_DM'.

The dummy data read-out unit 210 receives and amplifies the data of the dummy cell through the local I/O lines LIO and LIOb, which are connected to the bit line sense amplifier for the dummy cell, according to the read command, so as to output the dummy cell data 'D_DM'. As the dummy sensing enable signal 'IOSTB_DM' is enabled, the detection data 'DET' is output by latching the dummy cell data 'D_DM' for a predetermined time.

The voltage detecting unit 220 receives the detection data 'DET' from the dummy data read-out unit 210, and enables the detection code fixing signal 'FIX' according to a voltage level of the detection data 'DET'. As the detection code fixing signal 'FIX' is enabled, a further read operation is not carried out by disabling the detection code generating unit 110, the dummy sensing enable signal generating unit 120 and the dummy data read-out unit 210.

As the detection code fixing signal 'FIX' is enabled, the multiplexer 300 is driven. Before the detection fixing code 'FIX' is enabled, the multiplexer 300 outputs the default code 'DFT_CODE', which is input by a designer, as a delay code. After the detection fixing code 'FIX' is enabled, the multiplexer 300 outputs the detection code 'DET_CODE' generated by the detection code generating unit 110 as a delay code.

When the voltage detecting unit 220 verifies that the detection code 'DET_CODE' is different from the predetermined data, the detection code generating unit 110 is driven by the column select enable signal 'YI', which is input for the next read operation, and modifies the detection code 'DET_CODE'.

That is, the voltage difference between the local I/O lines LIO and LIOb, which are connected to the dummy cell, is obtained for a sensing margin after an appropriate delay time. Therefore, the signal delay time of the dummy sensing enable signal generating unit 120 is increased by modifying the detection code 'DET_CODE' according to the delay time.

Figure 4:
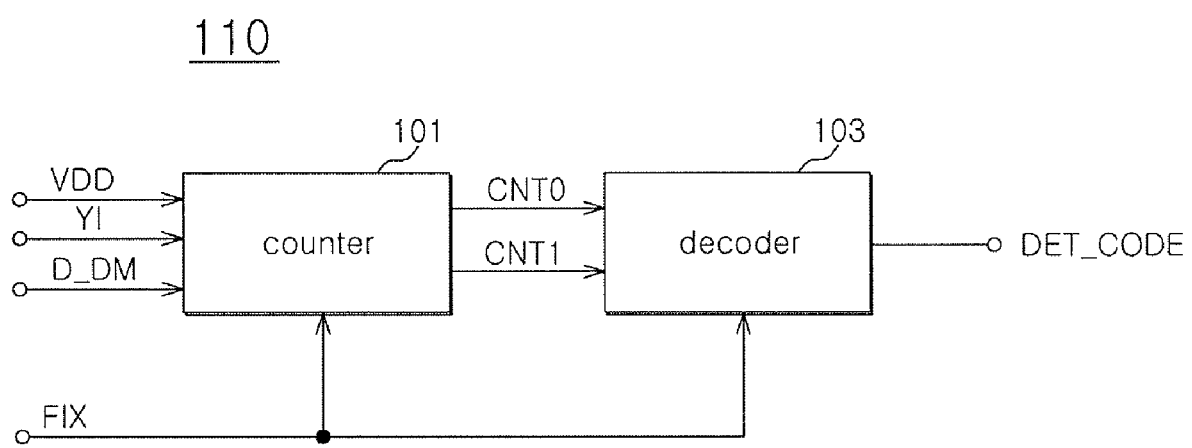
FIG. 4 is a block diagram showing an example of a structure of a detection code generating unit of FIG. 3.

FIG. 4 is a block diagram showing an example of a structure of the detection code generating unit 110 of FIG. 3.

As shown in FIG. 4, according to an embodiment of the present invention the detection code generating unit 110 includes a counter 101 and a decoder 103.

The counter 101 receives the power supply voltage 'VDD', the column select enable signal 'YI' and the dummy cell data 'D_DM' and modifies first and second count signals 'CNT0' and 'CNT1' when the voltage level of the dummy cell data 'D_DM' is different from the predetermined data level and the column select enable signal 'YI' is enabled. The counter maintains the first and second count signals 'CNT0' and 'CNT1' (i.e., does not change the first and second count signals 'CNT0' and 'CNT1') when the voltage level of the dummy cell data 'D_DM' is the same as the predetermined data level and the column select enable signal 'YI' is enabled.

The decoder 103 outputs the detection code 'DET_CODE' by decoding the first and second count signals 'CNT0' and 'CNT1'.

While the detection code fixing signal 'FIX' is enabled, the counter 101 and the decoder 103 are disabled and the operations thereof are not executed.

Figure 5:
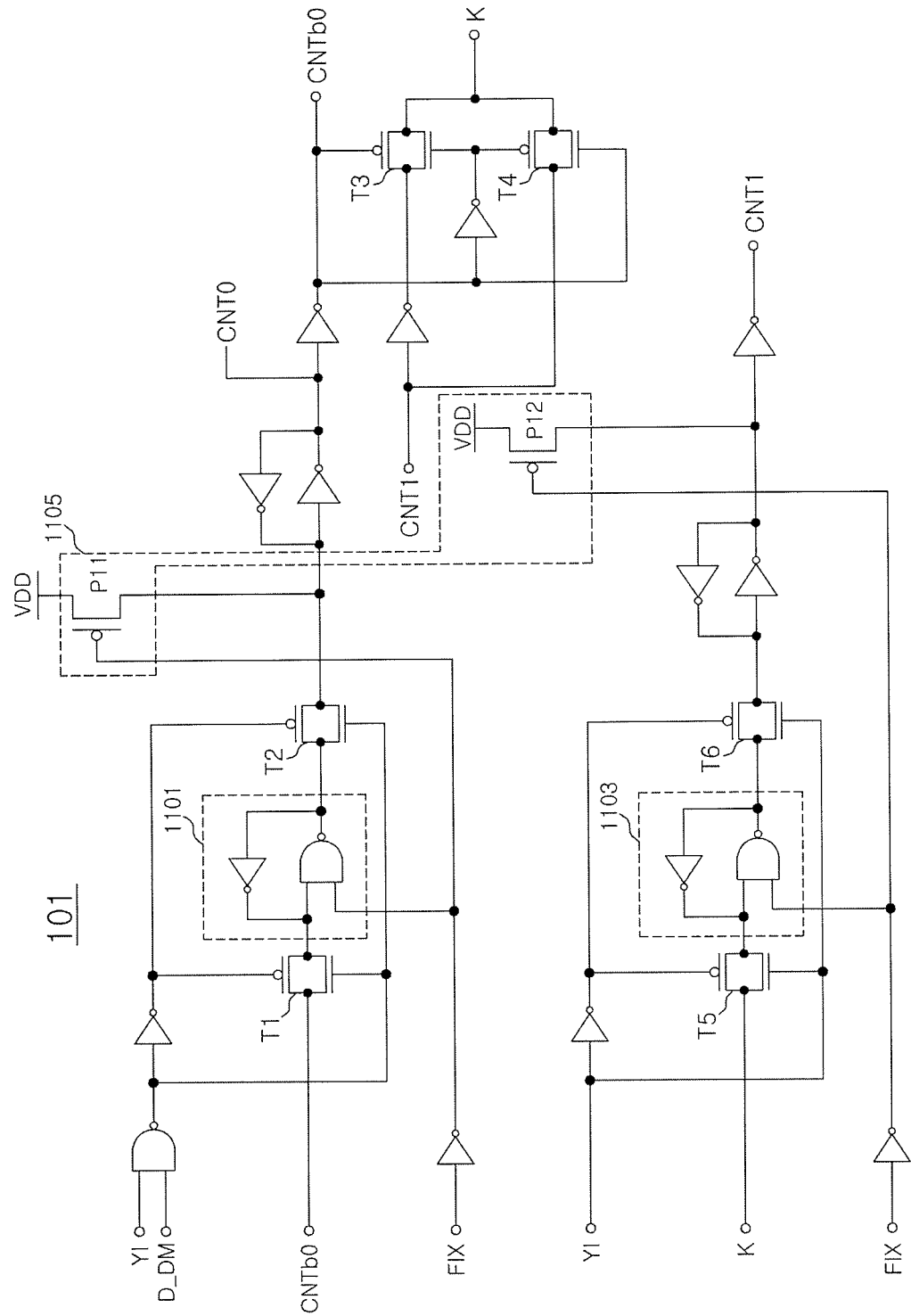
FIG. 5 is a circuit diagram showing an example of a structure of a counter of FIG. 4.

FIG. 5 is a circuit diagram showing an example of a structure of the counter 101 of FIG. 4.

According to an embodiment of the present invention, a high level data, as the predetermined data, can be stored in the dummy cell. When the column select enable signal 'YI' is enabled and the dummy cell data 'D_DM' is at a high level, the counter 101 does not carry out a counting operation. However when the column select enable signal 'YI' is enabled and the dummy cell data 'D_DM' is at a low level the counter does carry out a counting operation.

Referring to FIG. 5, when the column select enable signal 'YI' is enabled, a first transfer gate T1 is driven and the first transfer gate T1 transfers an inverted signal 'CNTb0' of the first count signal 'CNT0' when the dummy cell data 'D_DM' is not in the predetermined data level; for example, when the dummy cell data 'D_DM' is in a low level.

A first toggling unit 1101 receives an output of the first transfer gate T1 and the detection code fixing signal 'FIX', and the first toggling unit 1101 performs a toggle operation so as to invert and output the signal output by the first transfer gate T1 when the detection code fixing signal 'FIX' is in a disable state.

When the column select enable signal 'YI' is enabled, a second transfer gate T2 is driven and the second transfer gate T2 transfers an output of the first toggling unit 1101 when the dummy cell data 'D_DM' is not in the predetermined data level; for example, when the dummy cell data 'D_DM' is in a low level. An output signal of the second transfer gate T2 is inverted and output as the first count signal 'CNT0'.

As a result, the first count signal 'CNT0' is toggled into a low level or a high level when the dummy cell data 'D_DM' that is the same as the predetermined data level is not read out.

A third transfer gate T3 and a fourth transfer gate T4 are each driven by the first count signal 'CNT0', and the third transfer gate T3 and the fourth transfer gate T4 transfer one of the second count signal 'CNT1' and an inverted signal thereof to node K depending on the first count signal 'CNT0'.

A fifth transfer gate T5 is driven by the column select enable signal 'YI' and transfers a signal received from node K.

When the detection code fixing signal 'FIX' is in a disable state, a second toggling unit 1103 performs a toggle operation to invert and output the output signal of the fifth transfer gate T5.

A sixth transfer gate T6 is driven by the column select enable signal 'YI' and transfers an output signal of the second toggling unit 1103, and the second count signal 'CNT1' is derived from the output signal of the second toggling unit 1103.

As described above, the second count signal 'CNT1' is determined according to a value of the first count signal 'CNT0' in the counter 101 of FIG. 5.

When the column select enable signal 'YI' is first enabled and the dummy cell data 'D_DM' is in a low level, the output of the counter 101 is '01'. Even though the column select enable signal 'YI' is enabled for the next read operation, the output of the counter 101 is increased to '10' when the dummy cell data 'D_DM' is maintained at a low level.

At this time, when the column select enable signal 'YI' is enabled again and the dummy cell data 'D_DM' is in a high level, the first and second transfer gates T1 and T2 are turned off and the first count signal 'CNT0' is maintained in the previous state, i.e., '0'. The second count signal 'CNT1', which is determined by the first count signal 'CNT0', is also maintained in the previous state, i.e., '1'.

As a result, the counter 101 increases the count value whenever the column select enable signal 'YI' is enabled before the dummy cell data 'D_DM' is read out at the predetermined data level, and the counter 101 maintains the previous count value when the dummy cell data 'D_DM' is read out at the predetermined data level.

As shown in FIG. 4, according to an embodiment of the present invention the decoder 103 produces the detection code 'DET_CODE' using the first and second count signals 'CNT0' and 'CNT1'. Accordingly, when the count value is increased, the detection code 'DET_CODE' is changed so that the delay code value is also changed. When the count value is maintained as the previous value, the detection code 'DET_CODE' is not changed so that the generation time of the sensing enable signal can be controlled by the delay code determined in the previous state.

When the detection code fixing signal 'FIX' output from the voltage detecting unit 220 is enabled, an initialization unit 1105 including first and second transistors P11 and P12 is driven and the counter 101 is initialized regardless of the column select enable signal 'YI' and the voltage level of the dummy cell data 'D_DM'.

According to an embodiment of the present invention, the output values of the decoder 103 are controlled according to the output values of the counter 101, as shown in Table 1.

TABLE 1

| CNT0 | CNT1 | C0 | C1 | C2 | C3 |
|------|------|----|----|----|----|
| 0 | 0 | 1 | 0 | 0 | 0 |
| 1 | 0 | 1 | 1 | 0 | 0 |
| 0 | 1 | 1 | 1 | 1 | 0 |
| 1 | 1 | 1 | 1 | 1 | 1 |

Figure 6:
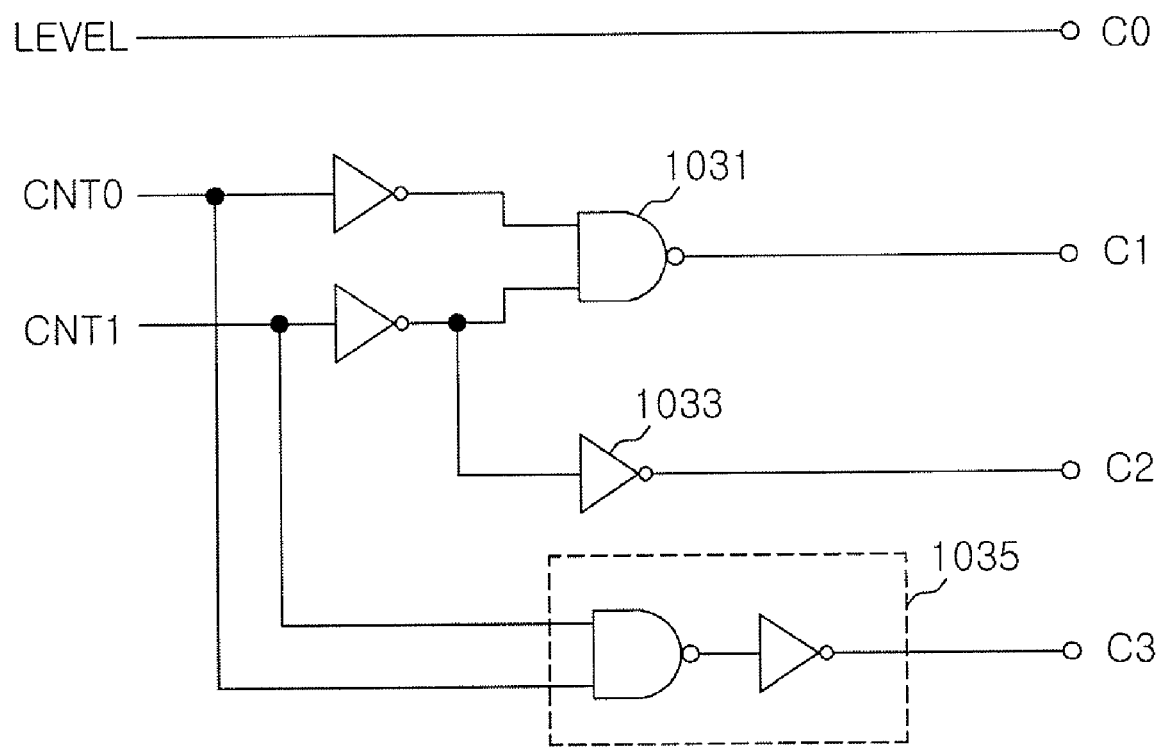
FIG. 6 is a circuit diagram showing an example of a structure of a decoder of FIG. 4.

To obtain the output values of the decoder 103 as shown in Table 1, code 0 (C0) is fixed to a specific voltage level (high level) and code 1 to code 3 (C1 to C3) can be produced by the decoder 103 of FIG. 6.

As shown in FIG. 6, the decoder 103 includes a first element 1031 that receives inverted signals of the first and second count signals 'CNT0' and 'CNT1' and outputs code 1 (C1). According to an embodiment of the present invention, the first element 1031 only outputs code 1 (C1) at a low level when the two input signals are at a high level. The decoder 103 includes a second element 1033 that inverts and delays the inverted signal of the second count signal 'CNT1' to output code 2 (C2). The decoder 103 also includes a third element 1035 that receives the first and second count signals 'CNT0' and 'CNT1' and outputs code 3 (C3). According to an embodiment of the present invention, the third element 1035 only outputs code 3 (C3) at a high level only when the two input signals are at a high level.

As mentioned above, the code 0 (C0) is fixed to a predetermine value 'LEVEL'.

According to an embodiment of the present invention, the first through third elements 1031, 1033, and 1035 can be implemented by logic gates. For example, the first element 1031 can be implemented using a NAND gate, the second element 1033 can be implemented using an odd number of inverters, and the third element 1035 can be implemented using a NAND gate connected to an inverter in series. Although the first to third inverters 1031, 1033, and 1035 have been described above using specific logic gates, it should be understood by one having skill in the art that other configurations are considered within the scope of the present invention.

On the other hand, the counter 101 and the decoder 103 can be variably implemented according to the scheme of the dummy sensing enable signal generating unit 120.

Figure 7:
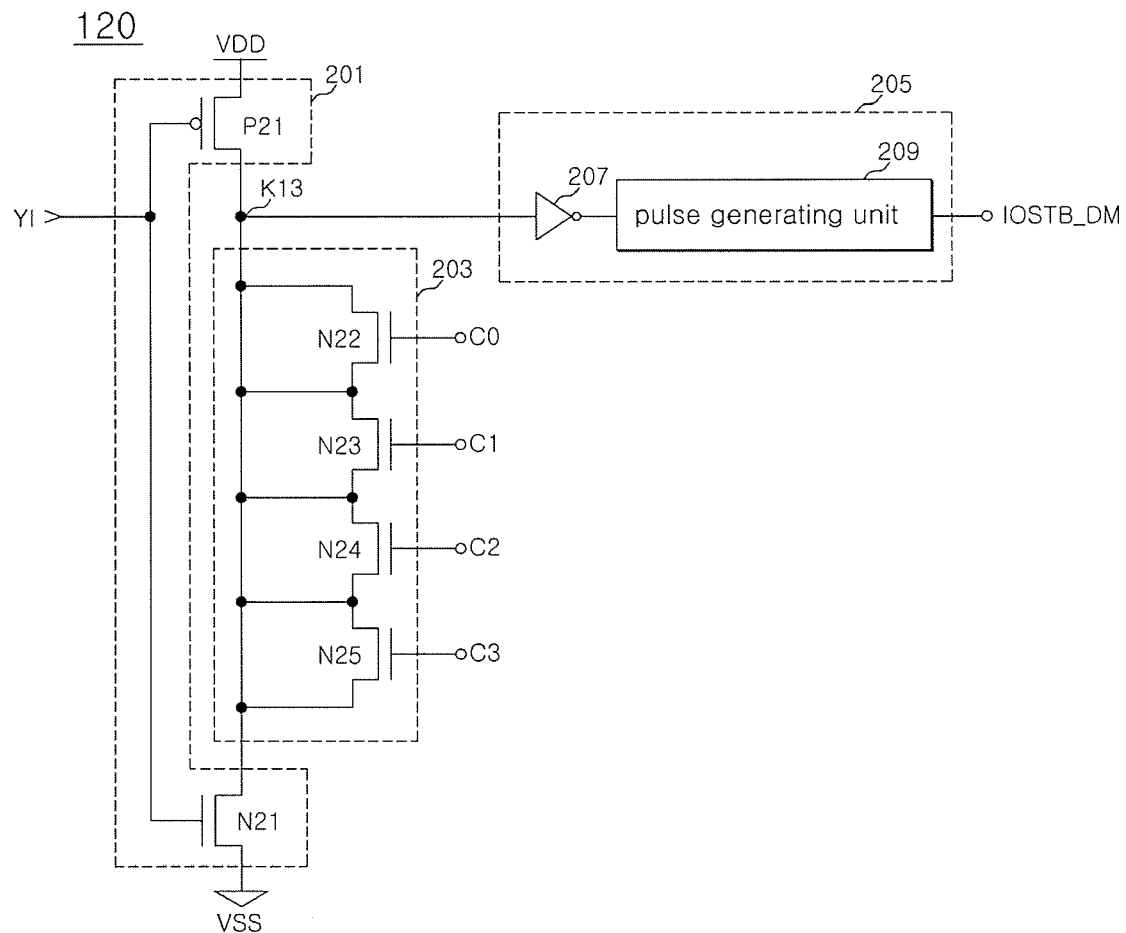
FIG. 7 is a circuit diagram showing an example of a structure of a dummy sensing enable signal generating unit of FIG. 3.

FIG. 7 is a circuit diagram showing an example of a structure of the dummy sensing enable signal generating unit 120 of FIG. 3.

According to an embodiment as shown in FIG. 7, the dummy sensing enable signal generating unit 120 can include an input unit 201, a delay unit 203, and an output unit 205. The input unit 201 inverts the column select enable signal 'YI'. The delay unit 203, which is connected to output node K13 of the input unit 201, modifies a resistance value at output node K13 according to the code values (C0, C1, C2, and C3) included in the detection code 'DET_CODE'. Furthermore, the output unit 205 is connected to output node K13 and outputs a signal applied to output node K13 by the input unit 201 after a predetermined delay time according to the delay unit 203.

In more detail, the input unit 201 includes a third transistor P21 coupled between the power supply voltage 'VDD' and the delay unit 203 and driven by the column select enable signal 'YI', and a fourth transistor N21 coupled between the delay unit 203 and a ground voltage 'VSS' and driven by the column select enable signal 'YI'.

Here, the third transistor P21 can be a PMOS transistor and the fourth transistor N21 can be an NMOS transistor, although it should be understood that this is by way of example only, and other configurations are considered possible according to the present invention.

The delay unit 203 includes fifth to eight transistors N22, N23, N24 and N25, which are connected to each other in parallel between the third transistor P21 and the fourth transistor N21 and driven by the detection code 'DET_CODE'.

Furthermore, the output unit 205 can include an inverting unit 207, for inverting the voltage level at output node K13, and a pulse generating unit 209, for receiving an output signal of the inverting unit 207 and outputting the dummy sensing enable signal 'IOSTB_DM'.

The driving of the transistors included in the delay unit 203 is determined according to the detection code 'DET_CODE' from the decoder 103. The output timing of the dummy sensing enable signal 'IOSTB_DM', which is output by delaying the column select enable signal 'YI', is varied.

Figure 8:
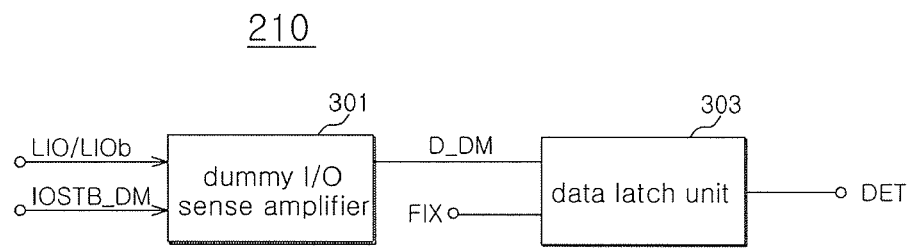
FIG. 8 is a block diagram showing an example of a structure of a dummy data read-out unit of FIG. 3.

FIG. 8 is a block diagram showing an example of a structure of the dummy data read-out unit 210 of FIG. 3.

Referring to FIG. 8, the dummy data read-out unit 210 includes a dummy I/O sense amplifier 301 and a data latch unit 303.

The dummy I/O sense amplifier 301 receives the dummy sensing enable signal 'IOSTB_DM', and amplifies the dummy data input from the local I/O lines LIO and LIOb and outputs the dummy cell data 'D_DM' when the dummy sensing enable signal 'IOSTB_DM' is enabled.

Furthermore, the data latch unit 303 stores the dummy cell data 'D_DM' for a predetermined time, provides the stored data to the voltage detecting unit 220, and is reset by the detection code fixing signal 'FIX'.

Figure 9:
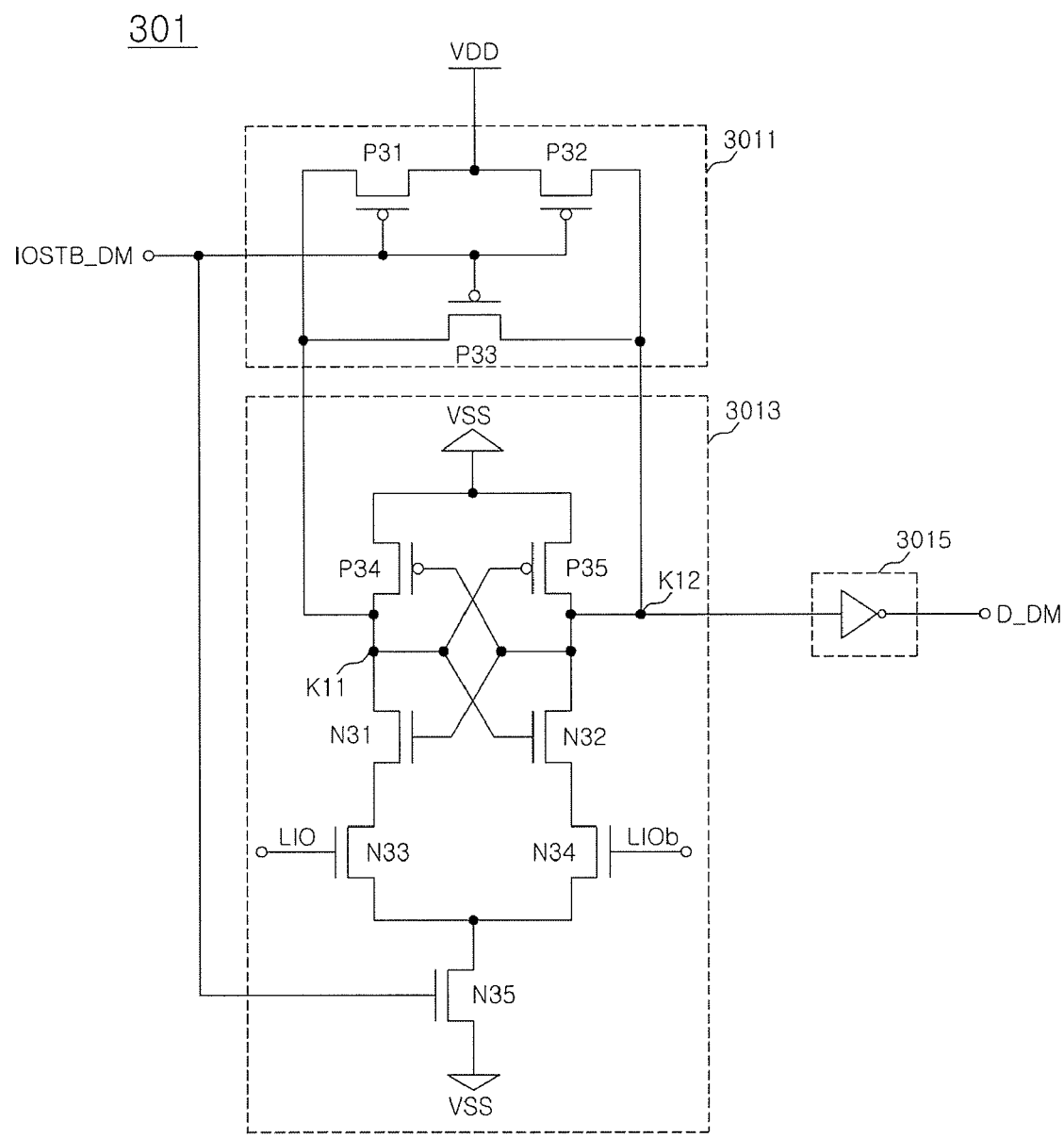
FIG. 9 is a circuit diagram showing an example of a structure of a dummy I/O sense amplifier of FIG. 8.

FIG. 9 is a circuit diagram showing an example of a structure of the dummy I/O sense amplifier 301 of FIG. 8.

Referring to FIG. 9, the dummy I/O sense amplifier 301 can make the dummy cell data 'D_DM' have a specific value, for example, a high level after the dummy sensing enable signal 'IOSTB_DM' is enabled in a high level. That is, when the dummy sensing enable signal 'IOSTB_DM' is disabled, the dummy cell data 'D_DM' is at a low level. Also, the dummy cell data 'D_DM' is maintained at a low level until the dummy sensing enable signal 'IOSTB_DM' is enabled and the voltage difference between the local I/O lines LIO and LIOb has a predetermined sensing margin ($\Delta V$). Thereafter, when the voltage difference between the local I/O lines LIO and LIOb exceeds the sensing margin (ΔV), the dummy cell data 'D_DM' is output at a high level.

As shown in FIG. 9, the dummy I/O sense amplifier 301 includes an equalizer 3011 that receives the dummy sensing enable signal 'IOSTB_DM' and equalizes node K11 and node K12 through the power supply voltage 'VDD'. Furthermore, the dummy I/O sense amplifier 301 includes an amplifier 3013, which is driven by a voltage signal applied to nodes K11 and K12, and the amplifier 3013 amplifies the signal on the local I/O lines LIO and LIOb. The dummy I/O sense amplifier 301 also includes an output unit 3015 which outputs a voltage at node K12.

In more detail, the equalizer 3011 includes a ninth transistor P31 coupled between node K11 and the power supply voltage 'VDD' and driven by the dummy sensing enable signal 'IOSTB_DM', a tenth transistor P32 coupled between the power supply voltage 'VDD' and node K12 and driven by the dummy sensing enable signal 'IOSTB_DM', and an eleventh transistor P33 coupled between node K11 and node K12 and driven by the dummy sensing enable signal 'IOSTB_DM'. Here, it is preferable that the ninth to eleventh transistors P31, P32 and P33 are implemented by PMOS transistors, although other configurations are possible according to the present invention.

According to an embodiment of the present invention, the amplifier 3013 is implemented by a cross-coupled amplifier. As shown in FIG. 9, the amplifier 3013 can include a twelfth transistor P34 coupled between the ground voltage 'VSS' and node K11 and driven by a signal applied to node K12, a thirteenth transistor P35 is coupled between the ground voltage 'VSS' and node K12 and driven by a signal applied to node K11, a fourteenth transistor N31 is coupled to node K11 and driven by a signal applied to node K12, a fifteenth transistor N32 is coupled to node K12 and driven by a signal applied to node K11, a sixteenth transistor N33 is coupled to the fourteenth transistor N31 and driven by a signal applied to the local I/O line LIO, a seventeenth transistor N34 coupled between the fifteenth transistor N32 and driven by a signal applied to the local I/O line LIOb, and an eighteenth transistor N35 coupled between a connection node of the sixteenth transistor N33 and the seventeenth transistor N34 and the ground voltage 'VSS' and driven by the dummy sensing enable signal 'IOSTB_DM'.

Here, the twelfth and thirteenth transistors P34 and P35 can be implemented by PMOS transistors and the fourteenth to eighteenth transistors N31, N32, N33, N34 and N35 can be implemented by NMOS transistors.

Furthermore, the output unit 3015 includes an inverter that drives the signal applied to node K12 and outputs the inverted signal as the dummy cell data 'D_DM'.

The operation of the dummy I/O sense amplifier 301 will be described in the case where '1' is stored as the fixed data in the dummy cell.

First, when the dummy sensing enable signal 'IOSTB_DM' is at a low level, a high level signal is applied to node K12 and the dummy cell data 'D_DM' is output at a low level.

When the dummy sensing enable signal 'IOSTB_DM' is enabled at a high level, a high level is maintained on node K12 until the voltage difference between the local I/O lines LIO and LIOb is sufficient for the amplification, i.e., until a high level signal is applied to the local I/O line LIO. When the voltage difference between the local I/O lines LIO and LIOb is sufficient for the amplification, node K12 is at a low level and the dummy cell data 'D_DM' is output at a high level.

Furthermore, as shown in FIG. 8, the dummy cell data 'D_DM' is delayed for a predetermined by the latch unit 303 and then the delayed signal, is output to the detection unit 220 as the detection data 'DET'.

However, in the detection unit 220, it is not possible to obtain the sensing margin by one comparison of the detection data with the predetermined data. Accordingly, it is preferable that the predetermined data is compared with a plurality of the dummy cell data 'D_DM' through a plurality of read operations.

Figure 10:
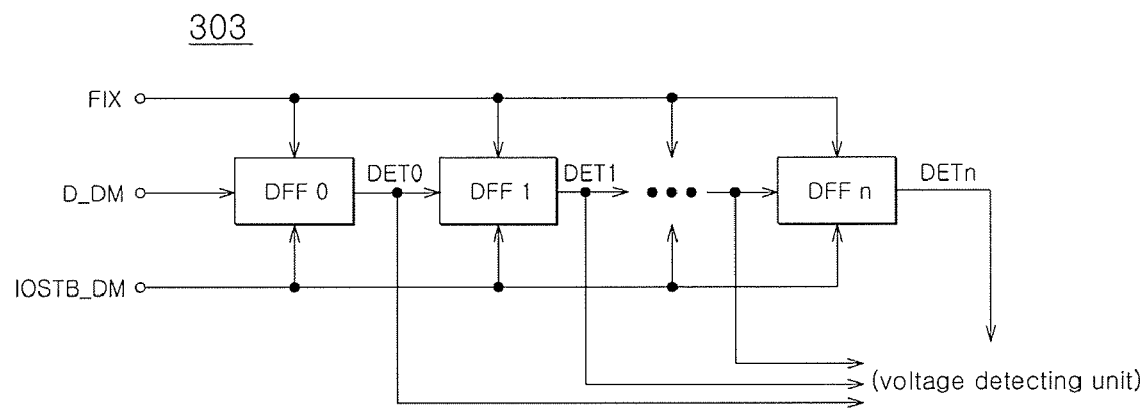
FIG. 10 is a circuit diagram showing an example of a structure of a data latch unit of FIG. 8.

FIG. 10 is a circuit diagram showing an example of a structure of the data latch unit 303 of FIG. 8.

As shown in FIG. 10, the data latch unit 303 includes a plurality of latches DFF0 to DFFn series coupled to each other in series.

In more detail, the plurality of latches DFF0 to DFFn are initialized by the detection code fixing signal 'FIX'. As the dummy sensing enable signal 'IOSTB_DM' is enabled and the dummy cell data 'D_DM' as an input signal is input, the input data are transferred to each of the subsequent latches and then the voltage detecting unit 220.

That is, whenever the dummy sensing enable signal 'IOSTB_DM' is enabled, the dummy cell data 'D_DM' are sequentially transferred to the next latches and then finally input into the voltage detecting unit 220. When the output signals of each the latches DFF0 to DFFn which form the latch unit 303 are the same, the voltage detecting unit 220 outputs the detection code fixing signal 'FIX'. For example, if the latch unit 303 has three latches and a high level data is output by each of the three latches, i.e., if the dummy cell is continuously read out three times, the detection code fixing signal 'FIX' is enabled.

Here, the latches can be implemented by D flip-flops, or the like, and the number of latches can be varied based on the reliability of the data latch unit 303.

Figure 11:
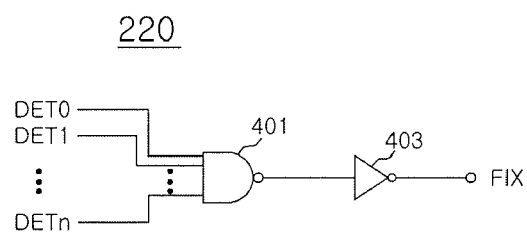
FIG. 11 is a circuit diagram showing an example of a structure of a voltage detecting unit of FIG. 3.

FIG. 11 is a circuit diagram showing an example of a structure of the voltage detecting unit 220 of FIG. 3.

Referring to FIG. 11, the voltage detecting unit 220 receives and compares the detection data 'DET0' to 'DETn' from the dummy data read-out unit 210 and enables the detection code fixing signal 'FIX' when each of the detection data 'DET0' to 'DETn' are the same level.

The voltage detecting unit 220 can be implemented to perform an AND operation using logic gates, for example, by connecting a NAND gate 401 to an inverter 403 in series.

The operation of the sensing enable signal control circuit will be described in detail referring to FIGS. 3 to 11.

In order to adopt an output delay time of the dummy sensing enable signal 'IOSTB_DM', which is used to read out the fixed data stored in the dummy cell, to a read operation of the actual memory cell, a specific data (any one of High, Low and Don't care) is stored as a fixed value in a specific dummy cell.

In this state, when the read command is input, the column select enable signal 'YI' is enabled and the dummy I/O sense amplifier 301 receives and amplifies the data from the local I/O lines LIO and LIOb, which are coupled to the dummy cell, and outputs the amplified data as the dummy cell data 'D_DM'.

Furthermore, the dummy sensing enable signal 'IOSTB_DM' is output from the dummy sensing enable signal generating unit 120 in response to the column select enable signal 'YI' so that the data amplified by the dummy I/O sense amplifier 301 is stored in the latch unit 303. At this time, the dummy sensing enable signal generating unit 120 determines an amount of delay of the dummy sensing enable signal 'IOSTB_DM' based on the initial detection code.

That is, since the counter 101, which is driven by the dummy data, does not work at the initial read operation, the output signals 'CNT0' and 'CNT1' of the counter 101 are '00' as shown in Table 1. Accordingly, when the detection code of C0 is fixed at a high level, the detection codes of C0 to C3 output by the decoder 103 in FIG. 6 are '1000', respectively. The dummy sensing enable signal generating unit 120 in FIG. 7 outputs the dummy sensing enable signal 'IOSTB_DM' based on the delay time of the detection code '1000'.

The voltage detecting unit 220 compares all the detection data 'DET0' to 'DETn' to verify whether the voltage levels of all the detection data 'DET0' to 'DETn', which are transferred from the data latch unit 303, are the same.

When the voltage levels of all the detection data 'DET' are the same, the previously output detection code of '1000' is output as the delay code.

However, since it is difficult to obtain the sensing margin through only a single comparison, it is preferable that a correct read operation of the dummy cell data 'D_DM' is verified by reading out the dummy cell data 'D_DM' several times (e.g., at least more than one time).

To achieve the verification, the read operations can be carried out based on the number (n) of latches included in the data latch unit 303.

When the read operations are repeatedly carried out, the detection code to produce the dummy sensing enable signal 'IOSTB_DM' is changed when the voltage levels of the detection data 'DET' are not the same and the enable signal 'IOSTB_DM' is not changed in when the voltage levels of the detection data 'DET' are the same.

That is, when the voltage levels of the detection data 'DET' that are sequentially input into the voltage detecting unit 220 are not the same, the counter 101 is driven by the column select enable signal 'YI' and the dummy cell data 'D_DM' and the output signals 'CNT0' and 'CNT1' of the counter 101 are changed.

Accordingly, the detection code 'DET_CODE' output from the decoder 103 is also changed.

For example, when the counter 101 is driven by the dummy cell data 'D_DM' and the output signals 'CNT0' and 'CNT1' of the counter 101 are changed into '10', the detection codes C0 to C3 output from the decoder 103 in FIG. 6 are '1100'. The dummy sensing enable signal 'IOSTB_DM', in which the delay time of the detection code '1100' is reflected, is output from the dummy sensing enable signal generating unit 120.

After the change of the detection code 'DET_CODE', the read operation and the detection code generating operation are repeatedly carried out according to the number of the latches and the final detection code is output as the delay code.

While the above-mentioned operations are carried out for the dummy cell, the read operation of the actual memory cell is carried out by a sensing enable signal that is produced by using the default code 'DFT_CODE' as the delay code.

When the detection code fixing signal 'FIX' output from the voltage detecting unit 220 is enabled, the detection code 'DET_CODE' is output from the multiplexer 300 so that the detection code 'DET_CODE' is used as the delay code, i.e., the default code 'DFT_CODE' is no longer used.

The delay code originated from the detection code 'DET_CODE' is input into, for example, the sensing enable signal generating unit 10 as shown in FIG. 10.

The sensing enable signal generating unit 10 receives the column select enable signal 'YI' and outputs the sensing enable signal 'IOSTB' by delaying the column select enable signal 'YI' in response to the delay code that is produced by the detection code 'DET_CODE'.

The time required to read out the data stored in the memory cell is varied according to the enabling time of the sensing enable signal 'IOSTB', according to an embodiment of the present invention the delay code according is produced in consideration of the operating speed of the actual cell, and the sensing enable signal 'IOSTB' is output by delaying the column select enable signal 'YI'.

That is, the sensing enable signal 'IOSTB' is produced according to the operation environment so that the operating characteristics of the semiconductor memory apparatus can be adapted to the operation environment and therefore improved.

The I/O sense amplifier 12 receives the data amplified by the bit line sense amplifier through the local I/O lines LIO and LIOb and amplifies and latches the data amplified by the bit line sense amplifier again. As the sensing enable signal 'IOSTB' is enabled according to the delay code originated from the detection code, the amplified data is transferred to the multiplexer 14 through the global I/O lines GIO and GIOb and then transferred to the pipe latch 16.

Finally, the data transferred to the pipe latch 16 is output to the output pad DQ through the output unit 18.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A sensing enable signal control circuit in a semiconductor memory apparatus comprising:
   a detection code generating unit configured to output a detection code according to a voltage level of a dummy cell data in response to a column select enable signal, the dummy cell data being read out from a dummy cell through at least one read operation; and
   a multiplexer configured to receive the detection code and a default code and output any one of the detection code and the default code as a delay code for delaying a sensing enable signal.

2. The sensing enable signal control circuit of claim 1, wherein the detection code generating unit comprises:
   a counter configured to output a count signal having a plurality of bits according to the voltage level of the dummy cell data in response to the column select enable signal; and
   a decoder configured to output the detection code by decoding the count signal having the plurality of bits.

3. The sensing enable signal control circuit of claim 1, further comprising:
   a dummy sensing enable signal generating unit configured to output a dummy sensing enable signal by delaying the column select enable signal in response to the detection code;
   a data read-out unit configured to output the dummy cell data and output detection data by delaying the dummy cell data in response to the dummy sensing enable signal; and
   a voltage detecting unit configured to output a detection code fixing signal according to a voltage level of the detection data.

4. The sensing enable signal control circuit of claim 3, wherein the multiplexer outputs the detection code as a delay code when the detection code fixing signal is enabled.

5. A sensing enable signal control circuit of a semiconductor memory apparatus comprising:
a delay code generating unit configured to output a dummy sensing enable signal by delaying a column select enable signal according to a detection code, the detection code being produced in response to the column select enable signal and a dummy cell data;
a comparison unit configured to output a detection code fixing signal based on a voltage level of the dummy cell data in response to the dummy sensing enable signal; and
a multiplexer configured to receive the detection code and a default code, and output any one of the detection code and the default code as a delay code to delay a sensing enable signal.

6. The sensing enable signal control circuit of claim 5, wherein the delay code generating unit comprises:
a detection code generating unit configured to receive the column select enable signal and the dummy cell data, and output the detection code; and
a dummy sensing enable signal generating unit configured to delay the column select enable signal in response to the detection code to output the dummy sensing enable signal.

7. The sensing enable signal control circuit of claim 6, wherein the detection code generating unit comprises:
a counter configured to output a count signal having a plurality of bits according to the voltage level of the dummy cell data in response to the column select enable signal; and
a decoder configured to output the detection code by decoding the count signal having the plurality of bits.

8. The sensing enable signal control circuit of claim 7, wherein the counter comprises:
a first transfer gate configured to pass an inverted signal of a first count signal according to the voltage level of the dummy cell data and the column select enable signal;
a first toggling unit configured to invert an output of the first transfer gate;
a second transfer gate configured to pass an output of the first toggling unit according to the voltage level of the dummy cell data and the column select enable signal and output the first count signal;
a third transfer gate;
a fourth transfer gate;
wherein the third and fourth transfer gates are configured to output one of a second count signal and an inverted signal of the second count signal to a first node, and the third and fourth transfer gates are selectively driven by the first count signal;
a fifth transfer gate configured to pass a signal applied to the first node according to the column select enable signal;
a second toggling unit configured to invert an output of the fifth transfer gate; and
a sixth transfer gate configured to pass an output of the second toggling unit in response to the column select enable signal and output the second count signal.

9. The sensing enable signal control circuit of claim 8, wherein the counter further comprises:
an initialization unit configured to initialize the first and second count signals in response to the detection code fixing signal.

10. The sensing enable signal control circuit of claim 6, wherein the dummy sensing enable signal generating unit comprises:
an input unit configured to invert the column select enable signal;
a delay unit coupled to an output node of the input unit and configured to delay an output of the input unit; and
an output unit coupled to the output node of the input unit and configured to output the dummy sensing enable signal.

11. The sensing enable signal control circuit of claim 10, wherein the input unit comprises:
a first transistor coupled between a power supply voltage and the delay unit and driven by the column select enable signal; and
a second transistor coupled between the delay unit and a ground voltage and driven by the column select enable signal.

12. The sensing enable signal control circuit of claim 10, wherein the delay unit comprises:
a plurality of transistors coupled to the output node, the plurality of transistors being driven by the detection code.

13. The sensing enable signal control circuit of claim 10, wherein the output unit comprises:
an inverting unit coupled to the output node; and
a pulse generating unit configured receive an output of the inverting unit so as to output the dummy sensing enable signal.

14. The sensing enable signal control circuit of claim 5, wherein the comparison unit comprises:
a dummy data read-out unit configured to output the dummy cell data and output detection data by delaying the dummy cell data in response to the dummy sensing enable signal; and
a voltage detecting unit configured to output the detection code fixing signal according to a voltage level of the detection data.

15. The sensing enable signal control circuit of claim 14, wherein the dummy data read-out unit comprises:
a dummy I/O sense amplifier configured to amplify a dummy cell data stored in a dummy cell and output the dummy cell data in response to the dummy sensing enable signal; and
a data latch unit configured to output the detection data by delaying the dummy cell data.

16. The sensing enable signal control circuit of claim 15, wherein the data latch unit comprises:
a plurality of latches coupled in series.

17. The sensing enable signal control circuit of claim 15, wherein the data latch unit comprises:
a plurality of latches coupled in series, wherein each of the latches is configured to latch the dummy cell data and output the latched dummy cell data to the voltage detection unit as the dummy sensing enable signal is enabled.

18. The sensing enable signal control circuit of claim 14, wherein the comparison unit sequentially outputs the detection data in response to a plurality of read commands, and
wherein the voltage detecting unit receives the detection data sequentially output by the comparison unit, compares the detection data, and outputs the detection code fixing signal when each of the detection data have substantially the same voltage level.

19. The sensing enable signal control circuit of claim 18, wherein the multiplexer outputs the detection code as a delay code as the detection code fixing signal is enabled.

* * * * *